United States Patent
Chen et al.

(10) Patent No.: US 11,137,213 B2
(45) Date of Patent: Oct. 5, 2021

(54) WATER COOLING HEAD

(71) Applicant: AURAS Technology Co., Ltd., New Taipei (TW)

(72) Inventors: Chien-An Chen, New Taipei (TW); Mu-Shu Fan, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 99 days.

(21) Appl. No.: 16/506,215

(22) Filed: Jul. 9, 2019

(65) Prior Publication Data

US 2020/0011609 A1 Jan. 9, 2020

Related U.S. Application Data

(60) Provisional application No. 62/695,220, filed on Jul. 9, 2018.

(30) Foreign Application Priority Data

Jun. 28, 2019 (TW) .................................. 108122937

(51) Int. Cl.
| | | |
|---|---|---|
| *F28D 15/00* | (2006.01) | |
| *F04D 29/02* | (2006.01) | |
| *F28D 15/02* | (2006.01) | |
| *F04D 1/02* | (2006.01) | |

(Continued)

(52) U.S. Cl.
CPC ............. *F28D 15/00* (2013.01); *F04D 1/025* (2013.01); *F04D 13/0633* (2013.01); *F04D 29/026* (2013.01); *H01L 23/473* (2013.01); *F28D 2015/0291* (2013.01)

(58) Field of Classification Search
CPC .... F04D 1/025; F04D 13/0633; F04D 29/026; F04D 29/5806; F04D 29/5893; F28D 15/00; F28D 2015/0291; H01L 23/473
See application file for complete search history.

(56) References Cited

U.S. PATENT DOCUMENTS

2001/0051097 A1* 12/2001 Takura ...................... F04D 3/02
                                                              417/355
2004/0052049 A1*  3/2004 Wu ..................... F28D 15/0266
                                                              361/699

(Continued)

*Primary Examiner* — Eric S Ruppert
*Assistant Examiner* — Hans R Weiland
(74) *Attorney, Agent, or Firm* — WPAT, PC

(57) ABSTRACT

A water cooling head includes water cooling head includes a casing, a base and a pump. The casing includes an inlet and an outlet. An outer side of the base has a heat-absorbing surface. A thermal conduction structure is disposed on an inner side of the base. An active space is defined by the base and the casing collaboratively. The pump includes a first magnetic element, a second magnetic element, an impeller and a pivotal part. The first magnetic element is located outside the active space. The first magnetic element is arranged between the impeller and the base along a direction perpendicular to the base. The pivotal part, the second magnetic element and the impeller are disposed within the active space. The pivotal part is connected with the impeller and arranged between the impeller and the base. The second magnetic element is installed on the pivotal part.

17 Claims, 2 Drawing Sheets

(51) Int. Cl.
  *H01L 23/473* (2006.01)
  *F04D 13/06* (2006.01)

(56) References Cited

U.S. PATENT DOCUMENTS

| | | | | |
|---|---|---|---|---|
| 2004/0240179 | A1* | 12/2004 | Koga | H01L 23/473 |
| | | | | 361/699 |
| 2006/0185829 | A1* | 8/2006 | Duan | H01L 23/473 |
| | | | | 165/104.33 |
| 2007/0000648 | A1* | 1/2007 | Crocker | H01L 23/473 |
| | | | | 165/104.33 |
| 2008/0053641 | A1* | 3/2008 | Lai | H01L 23/473 |
| | | | | 165/120 |
| 2009/0159244 | A1* | 6/2009 | Mounioloux | H01L 23/473 |
| | | | | 165/104.33 |
| 2010/0147494 | A1* | 6/2010 | Tsai | H01L 23/473 |
| | | | | 165/104.33 |
| 2014/0216694 | A1* | 8/2014 | Tsai | F28D 15/00 |
| | | | | 165/104.31 |
| 2014/0216695 | A1* | 8/2014 | Tsai | H01L 23/473 |
| | | | | 165/104.31 |
| 2016/0363967 | A1* | 12/2016 | Tsai | H05K 7/20272 |
| 2017/0215301 | A1* | 7/2017 | Zheng | H01L 23/473 |
| 2018/0023594 | A1* | 1/2018 | Sheng | F28D 15/00 |
| | | | | 165/104.31 |
| 2019/0239388 | A1* | 8/2019 | Tsai | H01L 23/473 |
| 2019/0317577 | A1* | 10/2019 | Lin | H05K 7/20263 |

\* cited by examiner

WATER COOLING HEAD

CROSS-REFERENCE TO RELATED APPLICATION

This application claims priority to U.S. Provisional Patent Application No. 62/695,220 filed Jul. 9, 2018, the contents of which are incorporated herein by reference.

FIELD OF THE INVENTION

The present invention relates to a heat dissipation module, and more particularly to a water cooling head.

BACKGROUND OF THE INVENTION

Nowadays, a water cooling head with a built-in pump has been introduced into the market. For stably circulating the working fluid along a one-direction loop, the casing the water cooling head is equipped with plural guiding structures for assisting in the impeller of the pump. However, too many guiding structures may increase the structural complexity of the water cooling head and increase the fabricating cost.

Therefore, there is a need of providing a water cooling head with the simplified constituents. Consequently, only the inherent structure of the impeller of the pump is able to guide the working fluid to circulate along the one-direction loop in order to meet the requirements of the industries.

SUMMARY OF THE INVENTION

For solving the drawbacks of the conventional technologies, the present invention provides an improved water cooling head. The structures of an impeller and a pivotal part of the water cooling head are specially designed to inhale the working fluid into an active space.

Moreover, an electromechanical chamber is concavely formed on an outer surface of a casing of the water cooling head. A magnetic element is disposed within the electromechanical chamber. Consequently, the layout flexibility of the electronic components will be improved.

In accordance with an embodiment of the present invention, a water cooling head is provided. The water cooling head includes a casing, a base and a pump. The casing includes an inlet and an outlet. An outer side of the base has a heat-absorbing surface. A thermal conduction structure is disposed on an inner side of the base. An active space is defined by the base and the casing collaboratively. The pump includes a first magnetic element, a second magnetic element, an impeller and a pivotal part. A working fluid is permitted to flow through the active space. The first magnetic element is located outside the active space. The first magnetic element is arranged between the impeller and the base along a direction perpendicular to the base. The pivotal part, the second magnetic element and the impeller are disposed within the active space. The pivotal part is connected with the impeller and arranged between the impeller and the base. The second magnetic element is installed on the pivotal part.

In an embodiment, the active space includes a heat-absorbing space, a channel and a drainage space. The heat-absorbing space is in communication with the inlet. The drainage space is in the communication with the outlet. The channel is in communication with the heat-absorbing space and the drainage space.

In an embodiment, the channel and the drainage space are disposed within the casing, and the heat-absorbing space is defined by the casing and the base collaboratively.

In an embodiment, the impeller is disposed within the drainage space, and the pivotal part is extended from the drainage space to the channel.

In an embodiment, the pivotal part includes a guiding structure. The working fluid is guided by the guiding structure, so that the working fluid is inhaled from the heat-absorbing space to the drainage space.

In an embodiment, the water cooling head further includes a shaft, and the pivotal part is sheathed around the shaft. While the pivotal part is rotated about the shaft, the pivotal part and the shaft are not synchronously rotated with each other.

In an embodiment, the shaft is extended from the drainage space to the heat-absorbing space.

In an embodiment, the water cooling head further includes a fixing bracket. The fixing bracket has a fixing recess, and the shaft is fixed in the fixing recess.

In an embodiment, the fixing bracket is installed on the base.

In an embodiment, the water cooling head further includes a shaft sleeve, and the shaft sleeve is installed in the pivotal part.

In an embodiment, the shaft sleeve is made of an abrasion-resistive material.

In an embodiment, the water cooling head further includes a shaft, and the pivotal part is sheathed around the shaft, wherein the shaft and the pivotal part are not synchronously rotated with each other.

In an embodiment, the shaft is extended from the drainage space to the heat-absorbing space.

In an embodiment, the water cooling head further includes a fixing bracket. The fixing bracket has a fixing recess. The shaft is fixed in the fixing recess.

In an embodiment, the fixing bracket is installed on the base.

In accordance with an embodiment of the present invention, a water cooling head is provided. The water cooling head includes a casing, a base and a pump. The casing includes an inlet and an outlet. An active space is defined by the base and the casing collaboratively. The active space includes a heat-absorbing space, a channel and a drainage space. The heat-absorbing space is in communication with the inlet. The drainage space is in the communication with the outlet. The channel is in communication with the heat-absorbing space and the drainage space. The pump includes a first magnetic element, a second magnetic element, an impeller and a pivotal part. The second magnetic element, the impeller and the pivotal part are disposed within the active space. An electromechanical chamber is arranged between the drainage space and the heat-absorbing space and concavely formed on an outer surface of the casing. The electromechanical chamber is isolated from the active space. The first magnetic element is accommodated within the electromechanical chamber.

In an embodiment, the electromechanical chamber is arranged around the channel. The second magnetic element is installed on the pivotal part and disposed within the channel.

In an embodiment, the water cooling head further includes a circuit board, and the circuit board is electrically connected with the first magnetic element.

In an embodiment, the water cooling head further includes a shaft, and the pivotal part is sheathed around the shaft. While the pivotal part is rotated about the shaft, the pivotal part and the shaft are not synchronously rotated with each other.

In an embodiment, the water cooling head further includes a shaft sleeve and a shaft. The shaft sleeve is installed in the pivotal part. The pivotal part is sheathed around the shaft. The shaft and the pivotal part are not synchronously rotated with each other.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
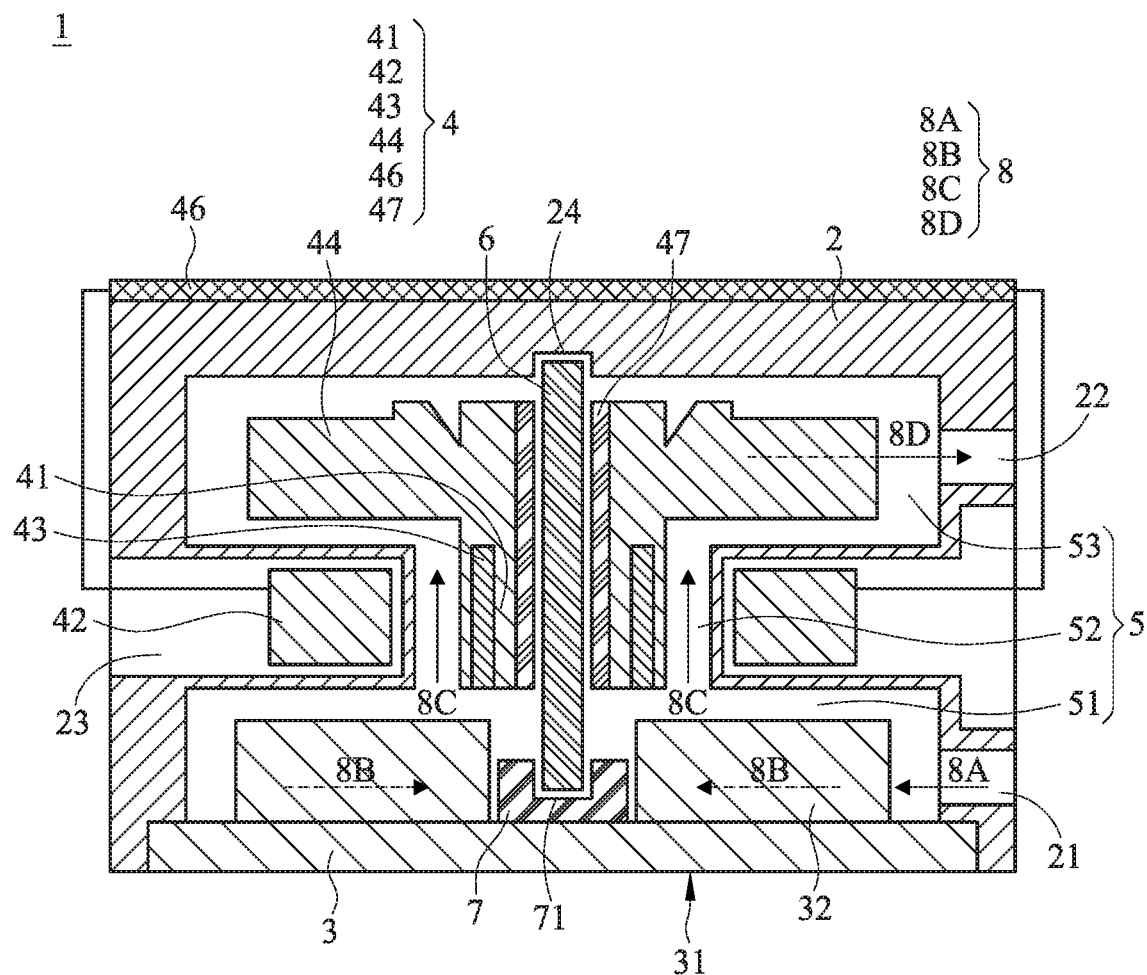
FIG. 1 is a schematic cross-sectional view illustrating the structure of a water cooling head according to an embodiment of the present invention.

The present invention provides a water cooling head with a built-in pump. FIG. 1 is a schematic cross-sectional view illustrating the structure of a water cooling head according to an embodiment of the present invention. The water cooling head 1 comprises a casing 2, a base 3 and a pump 4.

The casing 2 comprises an inlet 21 and an outlet 22. The inlet 21 and the outlet 22 are connected with other heat dissipation device (e.g., water cooling radiator) or pipes. Consequently, a working fluid (not shown) is introduced into the casing 2 or exited from the casing 2. The outer side of the base 3 has a heat-absorbing surface 31. A thermal conduction structure 32 is disposed or formed on the inner side of the base 3. When the heat-absorbing surface 31 is in contact with a heat source (not shown), the heat of the heat source is absorbed by the heat-absorbing surface 31 and transferred to the thermal conduction structure 32. Since the thermal conduction structure 32 is in contact with the working fluid (not shown), the heat is transferred from the thermal conduction structure 32 to the working fluid.

The thermal conduction structure 32 of the base 3 comprises skived fins, pin fins, straight fins or any other appropriate fins with irregular shapes. The types of the fins of the thermal conduction structure 32 are not restricted as long as the contact area between the fins and the working fluid is increased to facilitate transferring the heat to the working fluid. After the casing 2 and the base 3 are combined together through a screwing means or any other appropriate fixing means, an active space 5 for allowing the working fluid to go through is defined.

The active space 5 comprises a heat-absorbing space 51, a channel 52 and a drainage space 53. The heat-absorbing space 51 is in communication with the inlet 21. The drainage space 53 is in the communication with the outlet 22. The channel 52 is in communication with the heat-absorbing space 51 and the drainage space 53. Structurally, the channel 52 and the drainage space 53 are disposed within the casing 2. That is, the channel 52 and the drainage space 53 are inner structure of the casing 2. The heat-absorbing space 51 is defined by the casing 2 and the base 3 collaboratively.

Moreover, an electromechanical chamber 23 is arranged between the drainage space 53 and the heat-absorbing space 51 along a vertical direction. That is, the electromechanical chamber 23 is arranged around the channel 52 and concavely formed on an outer surface of the casing 2. The electromechanical chamber 23 is isolated from the active space 5. That is, the electromechanical chamber 23 is not in fluid communication with the active space 5. Consequently, the electromechanical chamber 23 is not in contact with the working fluid. In this embodiment, the electromechanical chamber 23 is located at the middle region of the casing 2. Consequently, some electronic components can be accommodated within the electromechanical chamber 23, and the overall height of the water cooling head 1 will be reduced.

Figure 2:
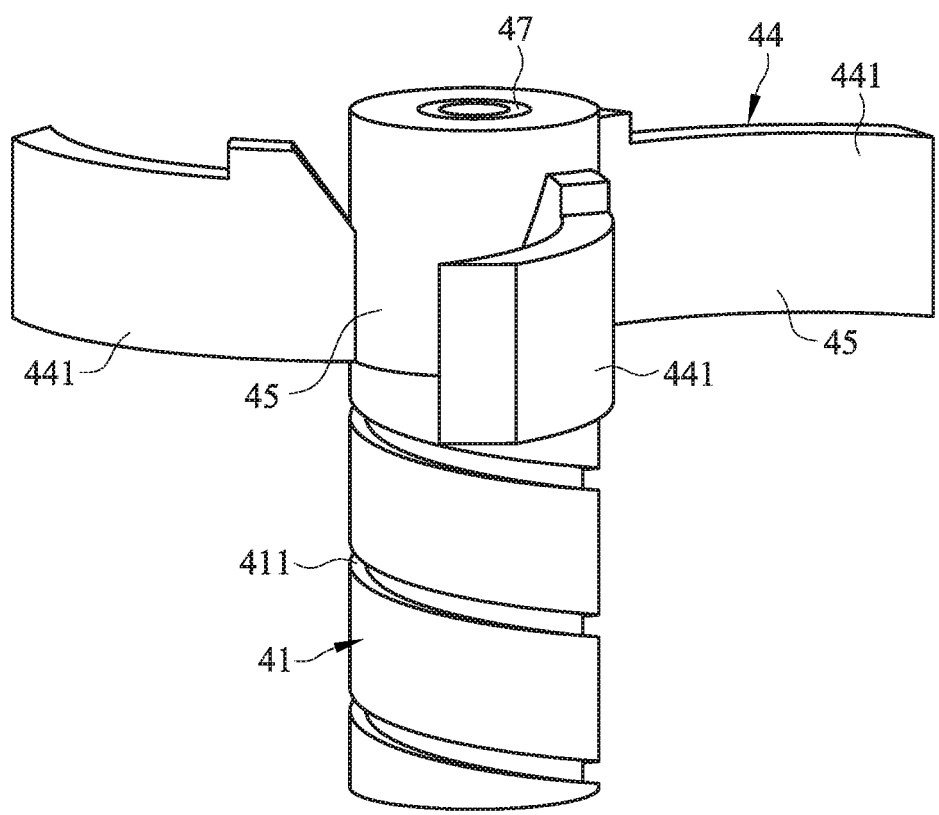
FIG. 2 is a schematic perspective view illustrating the structures of a pivotal part and an impeller of the water cooling head as shown in FIG. 1.

FIG. 2 is a schematic perspective view illustrating the structures of a pivotal part and an impeller of the water cooling head as shown in FIG. 1. Please refer to FIGS. 1 and 2. The pump 4 comprises a pivotal part 41, a first magnetic element 42, a second magnetic element 43, an impeller 44 and a circuit board 46. The circuit board 46 is electrically connected with the first magnetic element 42. The circuit board 46 and the first magnetic element 42 are located outside the active space 5, which is used for allowing the working fluid to go through. In this embodiment, the first magnetic element 42 is disposed within the electromechanical chamber 23. The circuit board 46 is located at a top side of the casing 2 or any other appropriate position (e.g., a lateral side of the casing 2) and electrically connected with the first magnetic element 42. The pivotal part 41, the second magnetic element 43 and the impeller 44 are disposed within the active space 5. The impeller 44 is disposed within the drainage space 53. The pivotal part 41 is extended from the drainage space 53 to the channel 52. Structurally, the pivotal part 41 is connected with the impeller 44. The pivotal part 41 is disposed between the impeller 44 and the base 3 along the direction perpendicular to the base 3. The impeller 44 comprises plural blades 441. The second magnetic element 43 is installed on the impeller 44 and/or the pivotal part 41. In the water cooling head 1 as shown in FIG. 1, the second magnetic element 43 is installed on the pivotal part 41 and disposed within the channel 52. Preferably but not exclusively, the first magnetic element 42 is a silicon steel plate or a magnet, and the second magnetic element 43 is a magnet. According to the interaction between the circuit board 46, the first magnetic element 42 and the second magnetic element 43, the pivotal part 41 and the impeller 44 are driven and rotated to guide the movement of the working fluid. Especially, the working fluid is guided upwardly from the heat-absorbing space 51 to the drainage space 53 through the channel 52. In this embodiment, the first magnetic element 42 is arranged between the impeller 44 and the base 3 along the direction perpendicular to the base 3. That is, the first magnetic element 42 is arranged between the inlet 21 and the outlet 22.

In addition, the water cooling head 1 further comprises a shaft 6 and a fixing bracket 7. Consequently, the pivotal part 41 and the impeller 44 are sheathed around the shaft 6 and rotated about the shaft 6. The pivotal part 41 and the impeller 44 are rotated in response to the electromagnetic effect between the first magnetic element 42 and the second magnetic element 43. That is, the pivotal part 41 and the impeller 44 are not driven by the shaft 6. Consequently, the pivotal part 41 and the shaft 6 are not synchronously rotated with each other. In this embodiment, the shaft 6 provides a positioning function. Consequently, during the rotation, the pivotal part 41 and the impeller 44 sheathed around the shaft 6 are not deviated. Moreover, with the assistance of the fixing bracket 7, the shaft 6 is not deviated or detached. Consequently, the pivotal part 41 and the impeller 44 within the water cooling head 1 can be stably and continuously rotated through the shaft 6 and the fixing bracket 7.

For maintaining the stable rotation of the pivotal part 41 and the impeller 44, the shaft 6 is extended downwardly from the drainage space 53 to the heat-absorbing space 51 through the channel 52. The top end and the bottom end of the shaft 6 are disposed in a fixing recess 24 of the casing 2 and a fixing recess 71 of the fixing bracket 7, respectively. In the embodiment of FIG. 1, the fixing bracket 7 is fixed on the base 3. It is noted that numerous modifications and alterations may be made while retaining the teachings of the invention. In another embodiment, the fixing bracket 7 is fixed on the thermal conduction structure 32 of the base 3. Alternatively, the fixing bracket 7 is fixed on the bottom wall of the casing 2.

For increasing the durability of the impeller 44 and the pivotal part 41 and reducing the abrasion between the impeller 44 (and the pivotal part 41) and the shaft 6, the water cooling head 1 is additionally equipped with a shaft sleeve 47. The shaft sleeve 47 is disposed within the water cooling head 1. Moreover, the shaft sleeve 47 is made of an abrasion-resistive material. For example, the abrasion-resistive material is composite plastic material (e.g., carbon-containing plastic material), polyphenylene sulfide (PPS) or polyoxymethylene (POM). The shaft sleeve 47 is installed and fixed in the pivotal part 41. The shaft sleeve 47 is sheathed around the shaft 6. As mentioned above, the pivotal part 41 and the impeller 44 are rotated in response to the electromagnetic effect caused by the interaction between the first magnetic element 42 and the second magnetic element 43. That is, the pivotal part 41 and the impeller 44 are not driven by the shaft 6. Consequently, the shaft sleeve 47 within the pivotal part 41 and the shaft 6 are not synchronously rotated with each other.

Please refer to the transferring path 8 of the working fluid within the water cooling head 1. After the working fluid is introduced into the heat-absorbing space 51 of the active space 5 through the inlet 21 along the arrow direction 8A, the working fluid absorbs the heat from the thermal conduction structure 32 along the arrow direction 8B. As the pivotal part 41 and the impeller 44 are rotated, the working fluid is inhaled and driven to be transferred upwardly through the channel 52 along the arrow direction 8C. After the working fluid is introduced into the drainage space 53, the working fluid is exited from the outlet 22 along the arrow direction 8d.

Please refer to FIGS. 1 and 2. One drainage chamber 45 is defined between every two adjacent blades 441 of the impeller 44 within the drainage space 53. Moreover, a guiding structure 411 (e.g., a flow-guiding groove) is formed on the pivotal part 41. While the pivotal part 41 and the impeller 44 are rotated in response to the electromagnetic effect between the first magnetic element 42 and the second magnetic element 43, the working fluid under the pivotal part 41 is inhaled and moved upwardly into at least one of the drainage chambers 45 along the guiding structure 411 of the pivotal part 41. Afterwards, the working fluid is rotated to outlet 22 and exited from the water cooling head 1 through the outlet 22.

In this embodiment, the guiding structure 411 is a flow-guiding groove that is formed in the outer surface of the pivotal part 41 and extended helically from bottom to top. It is noted that numerous modifications and alterations may be made while retaining the teachings of the invention. For example, in another embodiment, the pivotal part 41 is not equipped with the guiding structure 411. While the pivotal part 41 and the impeller 44 are rotated in response to the electromagnetic effect between the first magnetic element 42 and the second magnetic element 43, the working fluid under the pivotal part 41 is also inhaled and moved upwardly into at least one of the drainage chambers 45 along the pivotal part 41.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A water cooling head, comprising:
a casing comprising an inlet and an outlet;
a base, wherein an outer side of the base has a heat-absorbing surface, and a thermal conduction structure is disposed on an inner side of the base, wherein an active space is defined by the base and the casing collaboratively; and
a pump comprising a first magnetic element, a second magnetic element, an impeller and a pivotal part, wherein, a working fluid is permitted to flow through the active space, the first magnetic element is located outside the active space, the first magnetic element is disposed between the impeller and the base along a direction perpendicular to the base, and the pivotal part, the second magnetic element and the impeller are disposed within the active space, wherein the pivotal part is connected to the impeller and disposed between the impeller and the base, and the second magnetic element is installed on the pivotal part, wherein the active space comprises a heat-absorbing space, a channel and a drainage space, wherein the heat-absorbing space is in communication with the inlet, the drainage space is in the communication with the outlet, the channel is located between the heat-absorbing space and the drainage space, and the channel is in communication with the heat-absorbing space and the drainage space, wherein the impeller is disposed within the drainage space and the pivotal part is extended from the drainage space to the channel, wherein an electromechanical chamber is arranged between the drainage space and the heat-absorbing space and concavely formed on an outer surface of the casing, the electromechanical chamber is isolated from the active space, and the first magnetic element is accommodated within the electromechanical chamber, wherein the electromechanical chamber is arranged around the channel, and the second magnetic element is installed on the pivotal part and disposed within the channel.

2. The water cooling head according to claim 1, wherein the channel and the drainage space are disposed within the casing, and the heat-absorbing space is defined by the casing and the base collaboratively.

3. The water cooling head according to claim 1, wherein the pivotal part comprises a guiding structure, wherein the working fluid is guided by the guiding structure, so that the working fluid is inhaled from the heat-absorbing space to the drainage space.

4. The water cooling head according to claim 1, wherein the water cooling head further comprises a shaft, and the pivotal part is sheathed around the shaft, wherein while the pivotal part is rotated about the shaft, the pivotal part and the shaft are not synchronously rotated with each other.

5. The water cooling head according to claim 4, wherein the shaft extends from the drainage space to the heat-absorbing space.

6. The water cooling head according to claim 4, wherein the water cooling head further comprises a fixing bracket, wherein the fixing bracket comprises a fixing recess for disposing the shaft.

7. The water cooling head according to claim 6, wherein the fixing bracket is installed on the base.

8. The water cooling head according to claim 1 wherein the water cooling head further comprises a shaft sleeve, and the shaft sleeve is installed in the pivotal part.

9. The water cooling head according to claim 8, wherein the shaft sleeve is made of an abrasion-resistive material.

10. The water cooling head according to claim 8, wherein the water cooling head further comprises a shaft, and the pivotal part is sheathed around the shaft, wherein the shaft and the pivotal part are not synchronously rotated with each other.

11. The water cooling head according to claim 10, wherein the shaft extends from the drainage space to the heat-absorbing space.

12. The water cooling head according to claim 10, wherein the water cooling head further comprises a fixing bracket, wherein the fixing bracket comprises a fixing recess for disposing the shaft.

13. The water cooling head according to claim 12, wherein the fixing bracket is installed on the base.

14. A water cooling head, comprising:
a casing comprising an inlet and an outlet;
a base, wherein an active space is defined by the base and the casing collaboratively, and the active space comprises a heat-absorbing space, a channel and a drainage space, wherein the heat-absorbing space is in communication with the inlet, the drainage space is in the communication with the outlet, the channel is located between the heat-absorbing space and the drainage space, and the channel is in communication with the heat-absorbing space and the drainage space; and
a pump comprising a first magnetic element, a second magnetic element, an impeller and a pivotal part, wherein the second magnetic element, the impeller and the pivotal part are disposed within the active space,
wherein an electromechanical chamber is arranged between the drainage space and the heat-absorbing space and concavely formed on an outer surface of the casing, the electromechanical chamber is isolated from the active space, and the first magnetic element is accommodated within the electromechanical chamber, wherein the impeller is disposed within the drainage space and the pivotal part is extended from the drainage space to the channel, wherein the electromechanical chamber is arranged around the channel, and the second magnetic element is installed on the pivotal part and disposed within the channel.

15. The water cooling head according to claim 14, wherein the water cooling head further comprises a circuit board, and the circuit board is electrically connected with the first magnetic element.

16. The water cooling head according to claim 14, wherein the water cooling head further comprises a shaft, and the pivotal part is sheathed around the shaft, wherein while the pivotal part is rotated about the shaft, the pivotal part and the shaft are not synchronously rotated with each other.

17. The water cooling head according to claim 14, wherein the water cooling head further comprises a shaft sleeve and a shaft, wherein the shaft sleeve is installed in the pivotal part, the pivotal part is sheathed around the shaft, and the shaft and the pivotal part are not synchronously rotated with each other.

* * * * *